United States Patent [19]
Mishima

[11] Patent Number: 6,046,656
[45] Date of Patent: Apr. 4, 2000

[54] ELASTIC BOUNDARY WAVE DEVICE AND METHOD OF ITS MANUFACTURE

[75] Inventor: Naoyuki Mishima, Fujisawa, Japan

[73] Assignee: Kabushiki Kaisha Toshiba, Kawasaki, Japan

[21] Appl. No.: 09/147,485

[22] PCT Filed: May 6, 1998

[86] PCT No.: PCT/JP98/02008

§ 371 Date: Jan. 8, 1999

§ 102(e) Date: Jan. 8, 1999

[87] PCT Pub. No.: WO98/51011

PCT Pub. Date: Nov. 12, 1998

[30]   Foreign Application Priority Data

May 8, 1997   [JP]   Japan ................................. 9-118405

[51] Int. Cl.⁷ .............................. H03H 9/46; H03H 9/15
[52] U.S. Cl. ........................ 333/141; 333/193; 310/311; 310/313 R; 29/25.35
[58] Field of Search .................................. 333/141, 145, 333/150, 193, 195; 310/313 R, 313 A, 311; 29/25.35

[56]   References Cited

U.S. PATENT DOCUMENTS

| | | | |
|---|---|---|---|
| 3,736,532 | 5/1973 | Armenakas | 333/145 |
| 4,328,472 | 5/1982 | Grudkowski | 333/141 |
| 4,484,098 | 11/1984 | Cullen et al. | 310/313 A |
| 4,676,104 | 6/1987 | Cullen | 310/313 R X |
| 5,446,329 | 8/1995 | Nakahata et al. | 310/313 R X |
| 5,448,126 | 9/1995 | Eda et al. | 310/313 R X |

FOREIGN PATENT DOCUMENTS

| | | | |
|---|---|---|---|
| 58-175315 | 10/1983 | Japan . | |
| 5-48383 | 2/1993 | Japan | 333/193 |
| 5-83078 | 4/1993 | Japan | 333/193 |
| 7-212174 | 11/1995 | Japan . | |
| WO 9852279 A1 | 11/1998 | WIPO . | |

OTHER PUBLICATIONS

Yamaguchi, M. et al.; "Highly Piezoelectric Boundary Waves in Si/SiO$_2$/LiN6O$_3$ Structure", 1998 IEEE International Frequency Control Symposium, May 27–29, 1998, pp. 484–488.

Irino, T. et al.; "Optimized Stoneley Wave Device by Proper Choice of Glass Overcoat"; *IEEE Transactions on Ultrasonics, Ferroelectrics, and Frequency Control*, vol. 36, No. 2, Mar. 1989, pp. 159–167.

Irino, T. et al.; "Propagation of Boundary Acoustic Waves Along a ZnO Layer Between Two Materials"; *IEEE Transactions on Ultrasonics, Ferroelectrics, and Frequency Control*, vol. 35, No. 6, Nov. 1988, pp. 701–707.

Eda, K. et al.; "Novel Composite Piezoelectric Materials Using Direct Bonding Techniques", 1995 IEEE Ultrasonics Symposium, vol. 2, Nov. 7–10, 1995, pp. 921–924.

Toshio Irino, et al. "Study on Elastic Boundary Wave Propagated through Three–Medium Structure Having an Intermediate layer Containing ZnO (in Japanese)", Technical Research Report of IEICE, US86–39, 1986.

Naniwa K.K., Microfilm of the specification and drawings annexed to the request of Japanese Utility Model Application, No. 107435/1989 (Laid–open No. 46232/1991), Apr. 30, 1991, p. 9, lines 1 to 18.

Yasutaka Shimizu, Tokyo Institute of Technology, vol. J 65–C, No. 11, pp. 883–890, "The Theoretical Analysis of Stoneley Waves Propagating Along an Interface Between ZnO and Glass", Nov. 1982.

*Primary Examiner*—Benny Lee
*Assistant Examiner*—Barbara Summons
*Attorney, Agent, or Firm*—Oblon, Spivak, McClelland, Maier & Neustadt, P.C.

[57]   ABSTRACT

A boundary wave device and a fabrication method thereof that allow the conversion efficiency of a boundary wave excited by electrodes to be improved and prevents the device from being affected by parasitical resistance between the electrodes are provided. interdigital transducers 3 are formed on a main surface of a piezoelectric first substrate 2. A dielectric film 5 is formed on a main surface of the first substrate 2 so that the dielectric film 5 coats the interdigital transducers 3 and has a smooth surface 4. A Si second substrate 6 is layered on the dielectric film 5.

12 Claims, 5 Drawing Sheets

(a)

(b)

(c)

(d)

(e)

(f)

ELASTIC BOUNDARY WAVE DEVICE AND METHOD OF ITS MANUFACTURE

TECHNICAL FIELD

The present invention relates to a boundary wave device for use with a filter device and an oscillator in, for example, a TV set, a portable telephone unit, a PHS unit, and so forth and to a fabrication method thereof.

BACKGROUND ART

As an example of a device using an elastic wave, a SAW (Surface Acoustic Wave) device is well known. The SAW device is used for various circuits (such as a transmission band-pass filter, a reception band-pass filter, a local oscillation filter, an antenna duplexer, an IF filter, and an FM modulator) that process radio signals in a frequency band of, for example, 45 MHz to 2 GHz.

FIG. 8 shows a basic structure of such an SAW device. Referring FIG. 8, the SAW device is composed of a piezoelectorc substrate 100 and IDTs (Interdigital Transducers) 101 and 102. The piezoelectric substrate 100 is composed of, for example, $LiNbO_3$. The IDTs 101 and 102 are composed of a metal material such gas Al thin films. The IDTs 101 and 102 are formed on the piezelectric substrate 100 by etching or the like. When a racic frecuency electric signal is applied the IDT 101, a SAW 103 excited on the surface of the piezoelectric substrate 100. The excited SAW 103 is propagated to the IDT 102 through the surface of the piezoelectric substrate 100. The IDT 102 converts the SAW 103 into an electric signal.

Since the SAW device uses a boundary surface between the solid surface and vacuum or gas (namely, uses an elastic wave that is propagated through the solid surface), the surface of the piezoelectric substrate that is a propagation medium should be a free surface. Thus, chips on the SAW device cannot be packaged with plastic mold that is used for semiconductors. Thus, the SAW device should have a hollow portion that assures such a free surface.

However, when such a hollow portion is formed in the package, the cost of the device rises and the size thereof becomes larger.

SUMMARY OF THE INVENTION

Accordingly, the inventor of the present invention has proposed a boundary wave device that has functions similar to the SAW device and whose size and cost are easily reduced. In the boundary wave device, a piezoelectric substrate and a Si substrate are layered with IDTs disposed therebetween. The present invention is a modification of such a boundary wave device.

In other words, a first object of the resent invention is to provide boundary wave device and a fabrication method thereof that allow the conversion efficiency of an elastic wave excited by an electrode to be improved.

In addition, a second object of the cresent invention is to provide a boundary wave device from and a fabrication method thereof that prevent the device from being affected by parasitic resistance between electrodes.

To solve such problems, as one feature of the present invention is a boundary wave device, including a piezoelectric first substrate, a plurality of electrodes, formed on a main surface of the piezoelectric first substrate, for exciting a boundary wave, a dielectric film formed on the piezoelectric first substrate so that the dielectric film covers the plurality of electrodes and has a smooth surface thereon, and a Si second substrate lavered on the surface of the dielectric film.

The present invention is also directed to a fabrication method for a boundary wave device, including the steps of (a) forming a plurality of electrodes for exciting a boundary wave on a main surface of a piezoelectric first substrate, (b) forming a dielectric film on the main surface of the first substrate with the plurality of electrodes formed, (c) smoothing the surface of the dielectric film formed on the main surface of the piezoelectric first substrate, and (d) layering a Si second substrate on the surface of the smoothed dielectric film.

The present invention is also directed to a fabrication method, wherein the stcw (b) is performed by forming the dielectric film so that the thickness of the dielectric film is larger than the thickness of the plurality of electrodes, and wherein the step (c) is performed of smoothing the surface of the dielectric film so that tno plurality of elctcrodes are not exposed.

BEST MODE FOR CARRYING OUT THE IVENTION

A boundary wave device is conventionally fabricated in the following method. For example, Al electroces are firmed on the surface of a Si substrate. A dielectric film formed or, the surface of the Si substrate with the Al electrodes in such a manner that the dielectric film coats the Al electrodes and buries between the Al electrodes. Thereafter, the dielectric film is abraded until the Al electrodes are exposed. A piezoelectric substrate is layered on the surface of the Si substrate with the Al electrodes exposed. In this fabrication method, there are the following problems.

Figure 7:
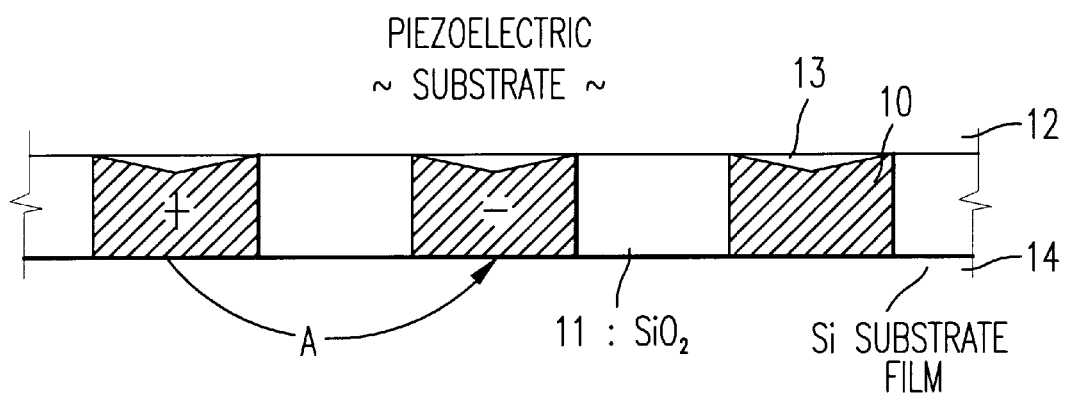
FIG. 7 is a schematic diagram for explaining a problem to be solved by the present invention.
Figure 8:
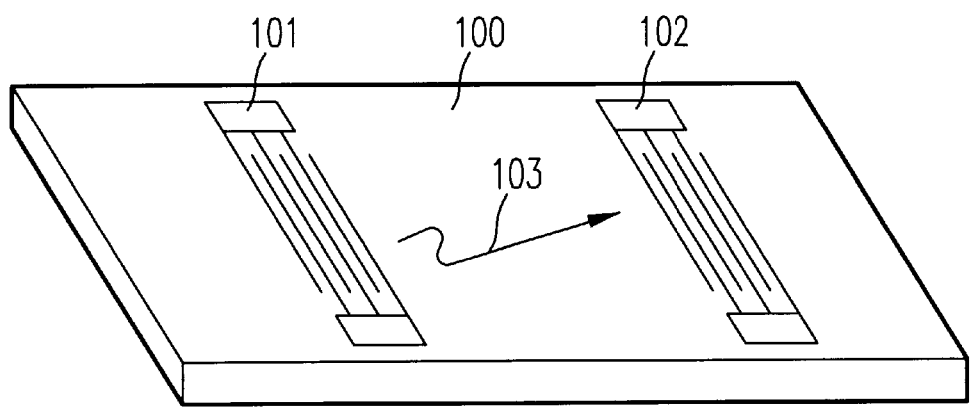
FIG. 8 is a schematic diagram showing a basic structure of a conventional SAW device.

As shown in FIG. 7, when the Al electrodes 10 are abraded, since they are softer than a $SiO_2$ film 11, dents are produced on the surfaces of the Al electrodes 10. The size of each dent is approximately 30 nm in comparison with approximately 5 $\mu$m of the width of each Al electrode. Such dents cause gaps between the Al electrodes 10 and the piezoelectric substrate 12. The gaps 13 prevent each Al electrode 10 and the piezoelectric substrate 12 from contacting, thus deteriorating the conversion efficiency of a boundary wave excited by the Al electrodes 10.

When the Al electrodes 10 directly contact the Si substrate 14, even if the specific resistance of the Si substrate s as high as 100Ω·cm, since conductivity takes place between Al electrodes 10, a reactive current A flows therebetween. Thus, the characteristics of the boundary wave device deteriorate. When the electrode width, the pitch, the electrode crossing width, and the nuricer of electrode pairs of an Al IDT are 1 μm, 2 μm, 0.1 mm, and 30, respectively, a parasitic resistance of 133Ω (that contributes as a reactive current to a parallel circuit) takes place. When the boundary wave device is used for a radio frequency fiter in a portable telephone unit, since the filter is normally used at 50 Ω, such a small parasitic resistance results in a large loss. Thus, such a filter cannot be practically used.

In contrast, according to the present invention, electrodes that excite a boundary wave are formed on a piezoelectric first substrate. A dielectric film is formed on the piezoelectric first substrate with the electrodes formed. Thereafter, the surface of the dielectric film is smoothed. Thus, the piezoelectric first substrate contacts the electrodes that excite a boundary wave without a gap. Consequently, the conversion efficiency of a boundary wave excited by the electrodes can be improved.

In addition, since the dielectric film is disposed between the electrodes that excite a boundary wave and the Si second substrate (in other words, the electrodes that excite a boundary wave do not directly contact the Si second substrate), the device can be prevented from being affected by the parasitical resistance between the electrodes.

Next, with reference to the accompanying drawings, an embodiment of the present invention will be described.

Figure 1:
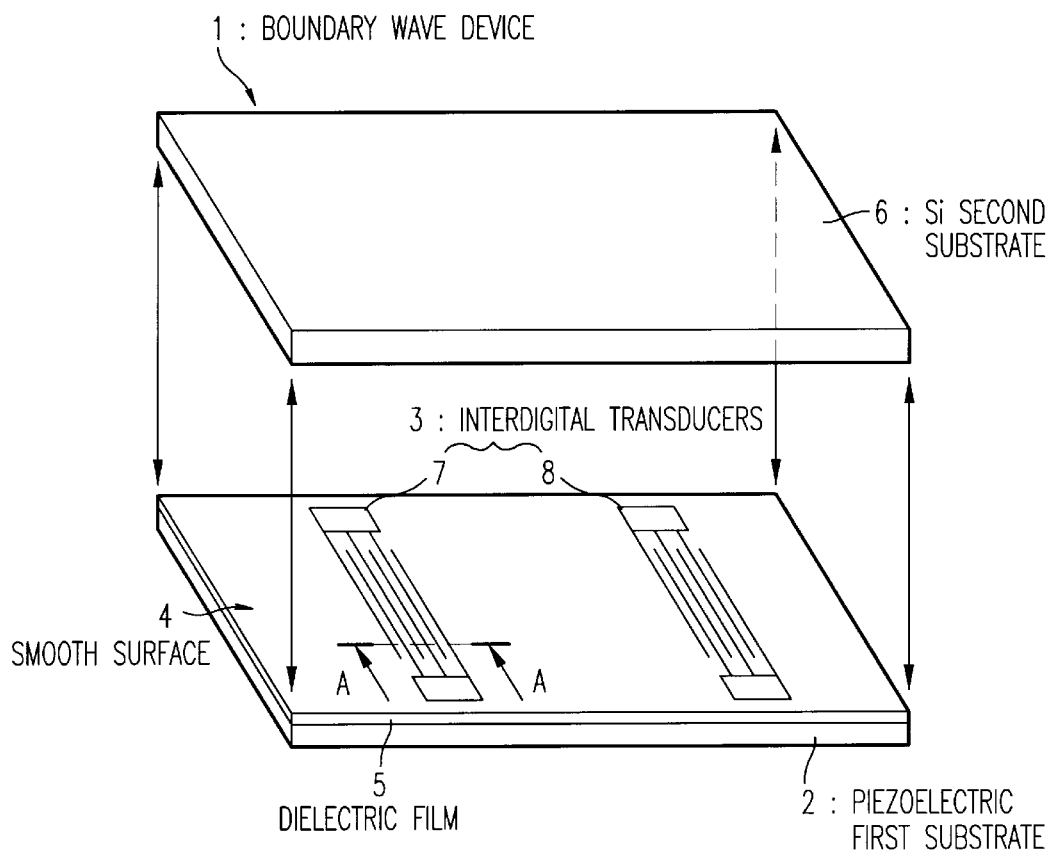
FIG. 1 is an exploded perspective view showing the structure of a boundary wave device according to an embodiment of the present invention.
Figure 2:
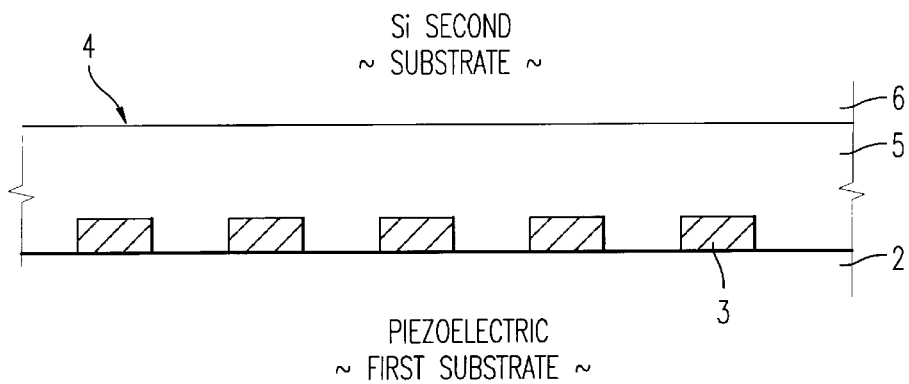
FIG. 2 is a plan view taken along line A—A of FIG. 1.

FIGS. 1 and 2 are schematic diagrams showing the structure of a boundary wave device according to an embodiment of the present invention. FIG. 1 is an exploded perspective view. FIG. 2 is a plan view taken from line A—A of FIG. 1.

Referring to FIGS. 1 and 2, a boundary wave device 1 is fabricated in the following method. IDTs 3 are formed on a main surface of piezoelectric first substrate 2. A dielectric film 5 is formed on a main surface of the first substrate 2 so that the dielectric film 5 coats the IDTs 3 and has a smooth surface 4. A Si second substrate 6 is layered on the main surface of the first substrate 2 on which the dielectric film 5 is formed.

The first substrate 2 is composed of, for example, LiNbO$_3$. Alternatively, another piezoelectric material such as LiTaO$_3$ or crystal may be used.

The material of the IDTs 3 is, for example, Al. Alternatively, another conductive material such as Cu, Ta, or an Al alloy thereof may be used. In addition, such materials may be laminated. The IDTs 3 are composed of a pair of exciting IDTs 7 and a pair of receiving IDTs 8; the pair of IDTs facing each other. Alternatively, a plurality of pairs of the exciting IDTs 7 and a plurality of pairs of the receiving IDTs 8 may be disposed. In addition, a reflecting electrode may be disposed in such a manner that it surrounds the IDTs 3. Moreover, an absorbing material may be disposed in such a manner that it surrounds these IDTs.

In other words, the boundary wave device according to the present invention can be used instead of, for example, the above-described conventional SAW device. The boundary wave device can be used for a filter, a delay line, a resonator, an oscillator, an analog signal processing circuit, an amplifier, and a convolver, a memory. However, in this case, the structure of the IDTs 3 may be varied corresponding to the application, specification, and so forth.

The dielectric film 5 is ccmrosod of, for example, SiO$_2$. The dielectric film 5 coats the IDTs 3 and has a smooth surface 4. In other words, the dielectric film 5 is formed between the IDTs 3 and the Si second substrate 6. In addition, the surface 4 of the dielectric film 5 bonds to the Si second substrate 6 without a gap.

The second substrate 6 is composed of, for example, Si. Alternatively, the second substrate 6 may be composed of another Si material such as amorphous silicon or polysilicon. Since the dielectric film 5 is formed between the IDTs 3 and the Si second substrate 6, when the Si second substrate 6 is of n– type or p– type with a low specific resistance that is normally used for a semiconductor integrated circuit, it can prevent a DC current from leaking from the IDTs 3.

A boundary wave is propagated through a boundary surface between two types of solid state substances. A theoretical study concerning the presence of the boundary wave has been reported by Shimizu, Irino, et. al. "Theoretical Study of Stoneley Wave that is propagated through a boundary surface between ZnO and glass", Journal of The Institute of Electronics and Communication Engineers, Japan (C), J65-C, 11, pp. 883–890. That paper describes a structure of which one of two types of solid state substances is ZnO that is a piezoelectric material and the other type is glass. At least one of the two types of solid state substances has lezoelectric characteristc for exciting a boundary wave. With a wave of which energy of a boundary wave concentrates on and is propagated tnrough a boundary surface between the two types of solid stat surstarices, a boundary wave device is accomplished.

Next, a fabrication method for the boundary wave device according to the present invention will be described.

Figure 3:
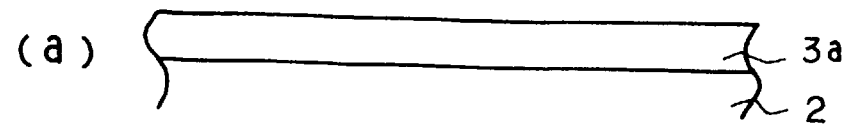
FIG. 3 is a schematic diagram showing fabrication steps in a fabrication method of a boundary wave device according to an embodiment of the present invention.
Figure 3:
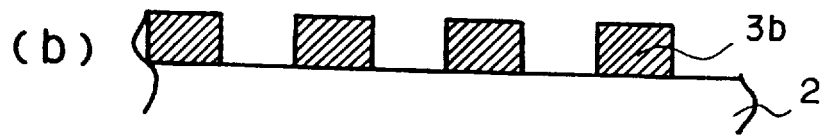
Figure 3:
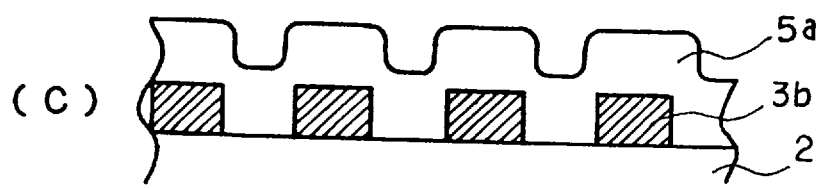
Figure 3:
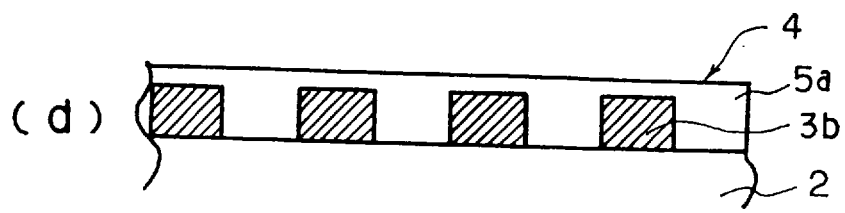
Figure 3:
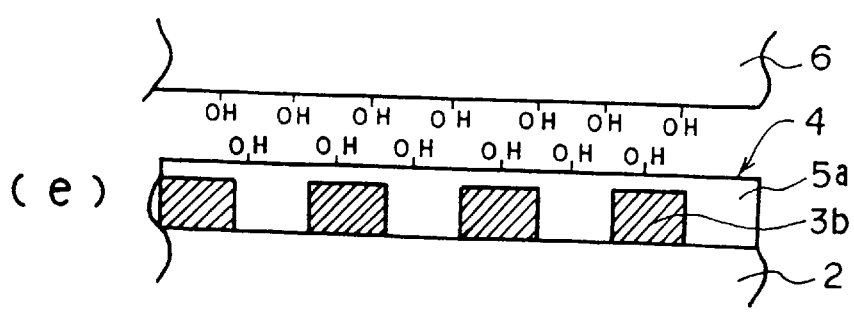
Figure 3:
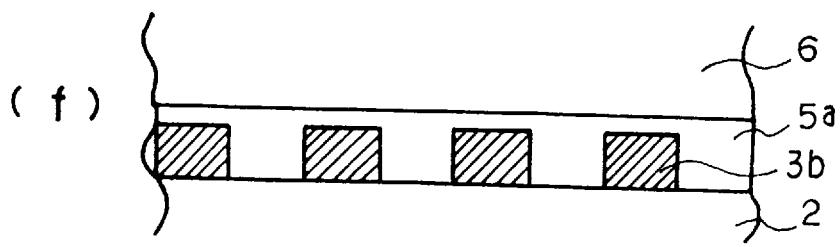

FIG. 3 is a schematic diagram for explaining a fabrication method for a boundary wave device according to an embodiment of the present invention. In this example, a boundary wave device used with a radio frequency signal at approximately 200 MHz is considered.

An Al film 3a is formed on a piezoelectric first substrate 2 by an evaporating method or sputter method (see FIG. 3(a)). The thickness of the Al film 3a is for example in the range from 0.02 to 0.07 λ(=0.10 to 0.15 μm) and preferably 0.05 λ(=0.12 μm) (where λ represents a wavelength).

Next, the Al film 3a is processed by for example photoengraving method. Thus, IDT patterns 3b are formed (see FIG. 3(b)).

A SiO$_2$ film 5a is formed on the piezoelectric first substrate 2 with the IDT patterns 3b by the spattering, method, and the like (see FIG. 3(c)). The thickness of the film 5a is for example in the range from 0.2 to 0.7 λ(=1.2 to 1.5 μm) and preferably slightly larger than 0.5 λ(=1.2 μm). Thus, the thickness of the SiO$_2$ film 5a should be larger than the thickness of the Al film 3a.

Next, the surface of the SiO$_2$ film 5a is abraded and smoothed to eliminate irregularity see FIG. 3(d)) so that the thickness of the SiO$_2$ film 5a is, for example, 0.5 λ(=1.2 μm). In this case, the IDT patterns 3b are covered with the SiO$_2$ film 5a.

Next, a surface 4 of the SiO$_2$ film 5a and a main surface of the Si second substrate 6 are treated with, for example, solution of ammonium peroxide. Thus, the surface of the SiO$_2$ film 5a and the main surface of the Si second substrate 6 are hydroxylated (see FIG. 3(e)).

The surface 4 of the SiO$_2$ film 5a and the main surface of the Si second substrate 6 are contacted and heated to approximately 300° C. for one to two hours (see FIG. 3(f)).

With such a heat treatment, OH groups on the surfaces of the two types of substrates bond together and H$_2$O becomes free. Thus, the SiO$_2$ film 5a and the Si second substrate 6 that are different materials are directly bonded. The heating temperature is preferably approximately 300° C. However, the heating temperature may be in the range from 100 to 1000° C. When the heating temperature is 100° C. or less, the OH groups of the two types of substrates do not bond together. On the other hand, when the heating temperature is 1000° C. or more, the heat may adversely affect the structural members of the device.

Figure 4:
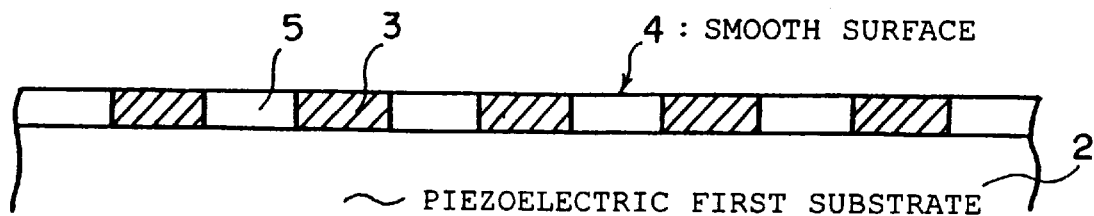
FIG. 4 is a schematic diagram for explaining another fabrication method of the Boundary wave device according to the present invention.

As shown in FIG. 2, in the boundary wave device fabricated at the above-described fabrication steps, the IDTs 3 and the piezcelectric first substrate 2 are bonded without a gap. Thus, the conversion efficiency of an elastic wave excited by the TDTs 3 can be improved. In addition, since the dielectric film 5 is formed between the IDTs 3 and the Si second substrate 6 (namely, the IDTs 3 and the Si second substrate 6 are not directly contacted), the device can be prevented from being affected by parasitic resistance between the IDTs 3. In the above-described fabrication method, as shown in FIG. 3(d), the surface of the SiO$_2$ film 5a is abraded so that the IDT patterns 3b are coated with the SiO$_2$ film 5a. Alternatively, as shown in FIG. 4, the surface of the SiO$_2$ film 5a may be abraded so that the IDT patterns 3b are exposed. This is because the conversion efficiency of an elastic wave excited by the IDTs 3 can be improved.

The boundary wave device according to the present invention can be used as a filter, a delay line, a resonator, an oscillator, an analog signal processing circuit, an amplifier, a convolver, a memory, and so forth. A filter, a delay line, a resonator, and so forth that have such boundary wave devices can be used for a portable telephone unit, a PHS unit, a TV set, and so forth.

Figure 5:
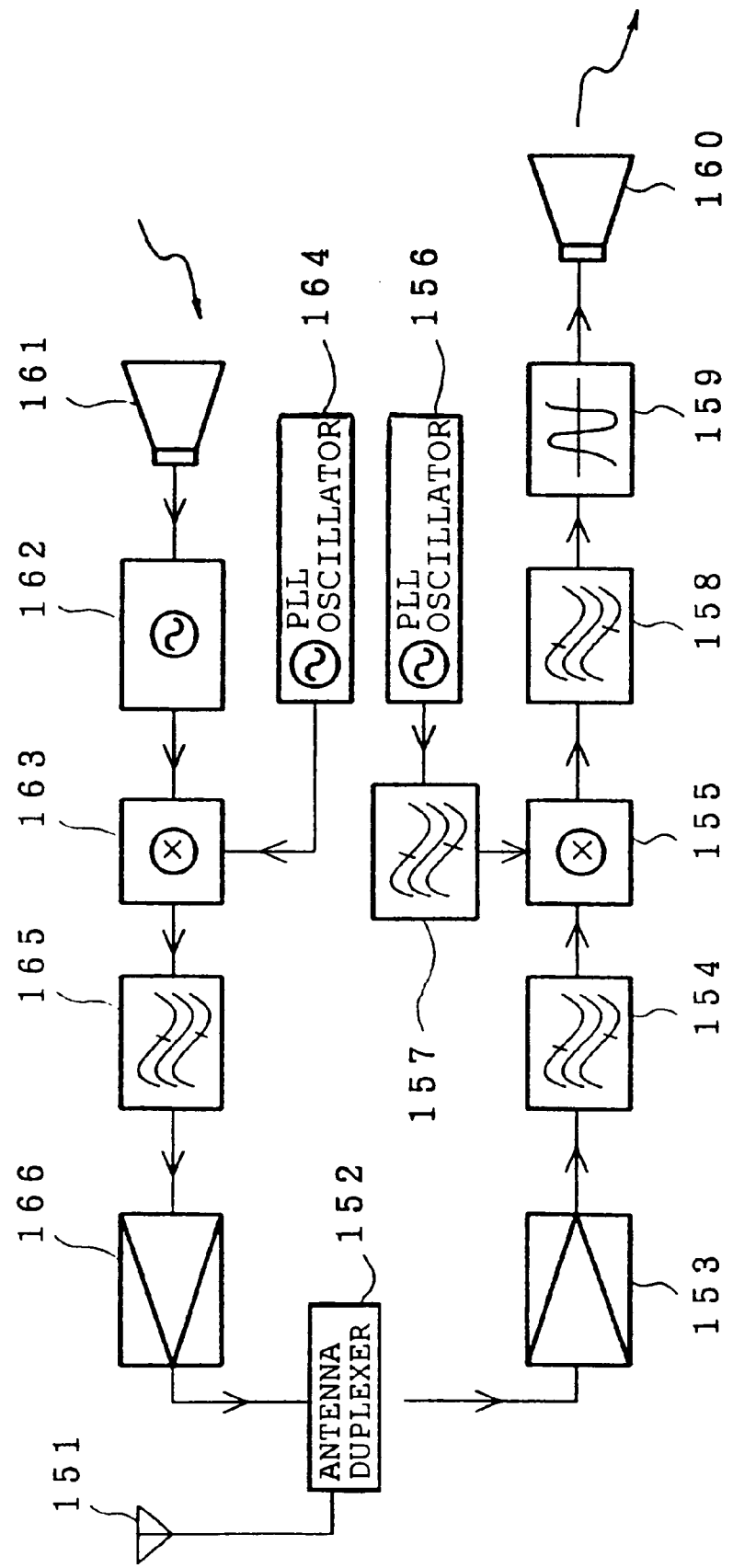
FIG. 5 is a block diagram showing the structure of a mobile communication unit having the boundary wave device according to the present invention.

FIG. 5 is a block diagram showing the structure of a mobile communication unit such as a portable telephone unit or a PHS unit.

Referring to FIG. 5, a radio wave received through an antenna 151 is separately supplied to a receiving system by an antenna duplexer 152. The separated signal is amplified by an amplifier 153. Thereafter, a reception band-pass filter 154 extracts a desired band. The resultant signal is inputted to a mixer 155. A local oscillation signal oscillated by a PLL oscillator 156 is inputted to the mixer 155 through a local oscillation filter 157. An output of the mixer 155 is outputted as a reception sound from a speaker 160 through an IF filter 158 and an FM demodulator 159. A transmission sound that is inputted from a microphone 161 is inputted to a mixer 163 through an FM modulator 162. A local oscillation signal oscillated by a PLL oscillator 164 is inputted to the mixer 163. An output of the mixer 163 is outputted as a transmission wave through a transmission band-path filter 165, a power amplifier 166, and the antenna duplexer 152.

The boundary wave device according to the present invention can be used for each portion of the mobile communication unit. For example, the boundary wave device according to the present invention can be used as an RF filter for each of the transmission band-pass filter 165, the reception band-pass filter 154, the local oscillation filter 157, and the antenna duplexer 152. In addition, the boundary wave device according to the present invention is used as a narrow-band IF filter necessary for selecting a channel. Moreover, the boundary wave device according to the present invention is used as a resonator for FM-modulating an audio signal in the FM modulator 162.

Figure 6:
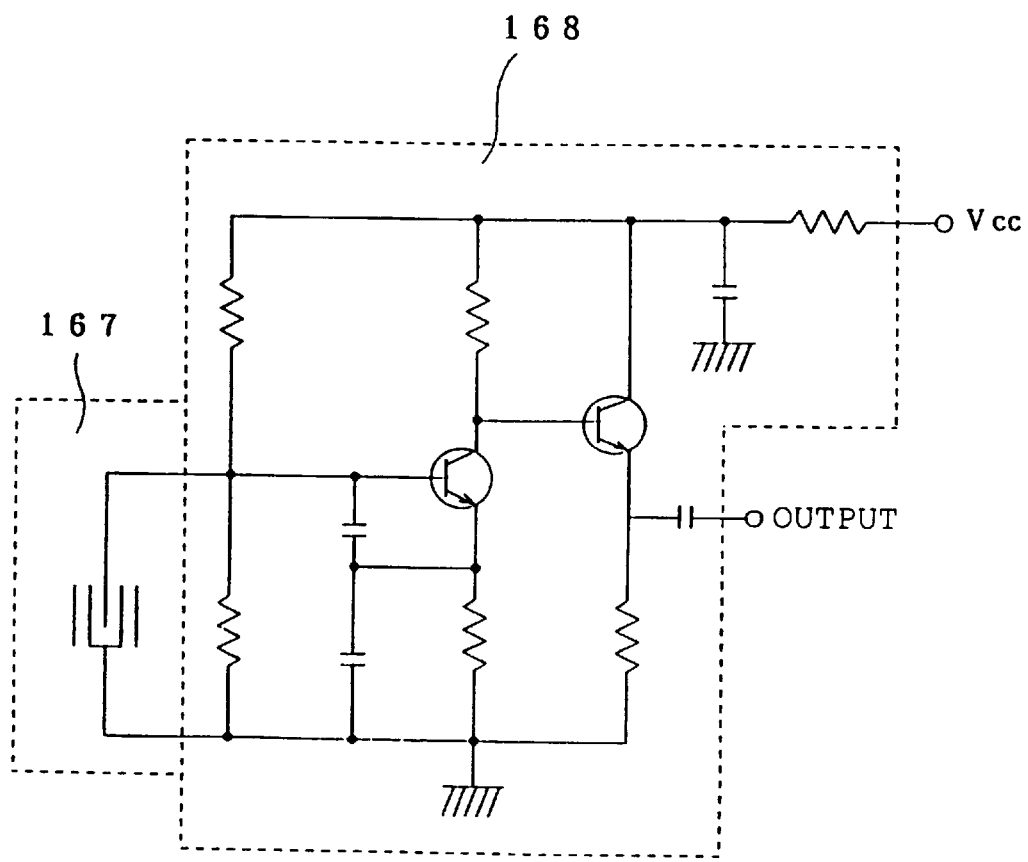
FIG. 6 is a schematic diagram showing an oscillating circuit of an RF modulator having the boundary wave device according to the present invention.

The boundary wave device according to the present invention can be used for an oscillating circuit of an RF modulator in a VTP and a CATV. FIG. 6 shows the structure of such a circuit. In FIG. 6, reference numeral 167 is a boundary wave device according to the present invention, and reference numeral 168 is a circuit portion.

INDUSTRIAL APPLICABILITY

As described above, since a boundary wave device according to the present invention comprises a piezoelectric first substrate, a plurality of electrodes, formed on a main surface of the piezoelectric first substrate, for exciting a boundary wave, a dielectric film firmed on the piezoelectric first substrate so that the dielectric film coats the plurality of electrodes and has a smooth surface, and a Si second substrate layered on the surface of the dielectric film, the conversion efficiency of a boundary wave exited by the electrodes can be improved. In addition, the device is prevented from being affected by parasitic resistance between the electrodes.

In addition, since a fabrication method for a boundary wave device according to the present invention comprises the steps of forming a plurality of electrodes for exciting a boundary wave on a main surface of a piezoelectric first substrate, forming a dielectric film on the main surface of the first substrate with the plurality of electrodes formed, smoothing the surface of the dielectric film formed on the main surface of the piezoelectric first substrate, and layering a Si second substrate on the surface of the smoothed dielectric film, the boundary wave device with an improved conversion efficiency of a boundary wave excited by the electrodes can he provided. In this case, when the thickness of the dielectric film is larger than the thickness of the plurality of electrodes and when the surface of the dielectric film is smoothed so that the plurality of electrode are not exposed, the device can be prevented from being affected by parasitical resistane between the electrode.

I claim:

1. A boundary wave device, comprising:

a first substrate formed of a piezoelectric material and having a main surface;

a plurality of electrodes, formed on the main surface of said first substrate, for exciting a boundary wave;

a dielectric film formed on said first substrate so as to completely cover said plurality of electrodes and having a smooth surface; and a second substrate layered on, to directly bond to, the smooth surface of said dielectric film.

2. A filter device comprising the boundary wave device according to claim 1.

3. The boundary wave device according to claim 1, wherein the dielectric film is formed of silicon oxide and has a thickness of 1.2 µm to 1.5 µm.

4. The boundary wave device according to claim 1, wherein the boundary wave device is used as a filter operated in a frequency of 45 MHz to 2 GHz.

5. The boundary wave device according to claim 1, wherein a thickness of the dielectric film is smaller than a wavelength λ of surface acoustic waves and larger than a thickness of the electrodes.

6. The boundary wave device according to claim 1, wherein the plurality of electrodes comprise at least one pair of interdigital transducers.

7. The boundary wave device according to claim 6, further comprising reflecting electrodes disposed to surround the inter-digital transducers.

8. The boundary wave device according to claim 1, wherein the second substrate is formed of a silicon base material.

9. The boundary wave device according to claim 1, wherein the plurality of electrodes are formed of a material selected from the group consisting of Al, Cu, Ta, and alloys thereof, and have a thickness of 0.10 μm to 0.15 μm.

10. A fabrication method for a boundary wave device, comprising the steps of:

(a) forming a plurality of electrodes for exciting a boundary wave on a main surface of a piezoelectric first substrate;

(b) forming a dielectric film on the main surface of the first substrate with the plurality of electrodes so as to completely cover the plurality of electrodes;

(c) smoothing the surface of the dielectric film formed on the main surface of the piezoelectric first substrate; and (d) layering a second substrate on the surface of the smoothed dielectric film.

11. The fabrication method as set forth in claim 10, wherein step (b) is performed by forming the dielectric film so that the thickness the dielectric film is larger than the thickness of the plurality of electrodes, and wherein the step (c) is performed by smoothing the surface of the dielectric film so that the plurality of electrodes are not exposed.

12. The fabrication method according to claim 10, wherein the layering step (d) further comprises the steps of (d1) treating the smoothed surface of the dielectric film formed on the first substrate having the plurality of electrodes thereon and a surface of the second substrate with a peroxide to hydroxylate, (d1) superposing the treated surface of the dielectric film on the treated surface of the second substrate to face each other, and (d3) heating the superposed members at a temperature of 100 to 1000° C. to directly bond together.

* * * * *

UNITED STATES PATENT AND TRADEMARK OFFICE
CERTIFICATE OF CORRECTION

PATENT NO. : 6,046,656
DATED : April 4, 2000
INVENTOR(S): Naoyuki Mishima

It is certified that an error appears in the above-identified patent and that said Letters Patent is hereby corrected as shown below:

In column 1, line 25, change "racic" to --radio--.

In column 2, line 12, change "stcw" to --step--.

In column 2, line 16, change "tno" to --the--.

In column 2, line 29, change "Boundary" to --boundary--.

In column 3, line 5, change "nuricer" to --number--.

In column 3, line 9, change "fiter" to --filter--.

In column 3, line 66, change "ccmrosod" to --composed--.

In column 4, line 25, change "lezoelectric" to --piezoelectric--.

In column 4, line 28, change "stat surstarices" to --state substances--.

In column 5, line 12, change "piezcelectric" to --piezoelectric--.

In column 5, line 67, change "VTP" to --VTR--.

Signed and Sealed this

Seventeenth Day of April, 2001

Attest:

NICHOLAS P. GODICI

*Attesting Officer*     *Acting Director of the United States Patent and Trademark Office*